United States Patent
David et al.

(10) Patent No.: US 10,607,925 B2
(45) Date of Patent: Mar. 31, 2020

(54) INTEGRATED CIRCUIT PACKAGE HAVING A RAISED LEAD EDGE

(71) Applicant: Allegro MicroSystems, LLC, Manchester, NH (US)

(72) Inventors: Paul A. David, Bow, NH (US); William P. Taylor, Amherst, NH (US)

(73) Assignee: ALLEGRO MICROSYSTEMS, LLC, Manchester, NH (US)

( * ) Notice: Subject to any disclaimer, the term of this patent is extended or adjusted under 35 U.S.C. 154(b) by 212 days.

(21) Appl. No.: 15/727,126

(22) Filed: Oct. 6, 2017

(65) Prior Publication Data
US 2019/0109072 A1 Apr. 11, 2019

(51) Int. Cl.
| | |
|---|---|
| H01L 23/495 | (2006.01) |
| H01L 21/48 | (2006.01) |
| H01L 23/31 | (2006.01) |
| H01L 23/00 | (2006.01) |
| H01L 43/02 | (2006.01) |
| G01R 33/02 | (2006.01) |
| G01R 33/00 | (2006.01) |
| G01R 33/07 | (2006.01) |
| G01R 33/09 | (2006.01) |

(52) U.S. Cl.
CPC ...... *H01L 23/4952* (2013.01); *G01R 33/0047* (2013.01); *G01R 33/0052* (2013.01); *G01R 33/02* (2013.01); *H01L 21/4832* (2013.01); *H01L 23/3114* (2013.01); *H01L 23/4951* (2013.01); *H01L 23/49503* (2013.01); *H01L 23/49548* (2013.01); *H01L 23/49551* (2013.01); *H01L 23/49575* (2013.01); *H01L 24/45* (2013.01); *H01L 24/48* (2013.01); *H01L 24/73* (2013.01); *H01L 24/83* (2013.01); *H01L 43/02* (2013.01); *G01R 33/07* (2013.01); *G01R 33/09* (2013.01); *H01L 23/3107* (2013.01); *H01L 2924/00014* (2013.01)

(58) Field of Classification Search
None
See application file for complete search history.

(56) References Cited

U.S. PATENT DOCUMENTS

| | | | | |
|---|---|---|---|---|
| 5,585,668 | A * | 12/1996 | Burns | H01L 23/4334 257/666 |
| 6,661,083 | B2 * | 12/2003 | Lee | H01L 23/3107 257/666 |
| 2001/0044169 | A1 * | 11/2001 | Yasunaga | H01L 21/561 438/112 |
| 2007/0145972 | A1 * | 6/2007 | Auburger | G01P 3/488 324/252 |
| 2008/0298784 | A1 * | 12/2008 | Kastner | G01P 3/44 388/811 |
| 2009/0140726 | A1 * | 6/2009 | Janke | G01R 33/07 324/207.13 |
| 2013/0235636 | A1 * | 9/2013 | Kadoguchi | H01L 23/49562 363/131 |

(Continued)

*Primary Examiner* — Nilufa Rahim
(74) *Attorney, Agent, or Firm* — Daly, Crowley, Mofford & Durkee, LLP

(57) ABSTRACT

An integrated circuit package includes a lead frame having a first surface, a second opposing surface, at least one die attach portion configured to support at least one die, and a plurality of leads, wherein at least one of the leads has a raised feature extending along a portion of a length of the lead.

36 Claims, 4 Drawing Sheets

(56) References Cited

U.S. PATENT DOCUMENTS

| | | | |
|---|---|---|---|
| 2014/0175627 A1* | 6/2014 | Cruz | H01L 23/49575 257/676 |
| 2015/0325501 A1* | 11/2015 | Sutton | H01L 23/49503 257/676 |
| 2017/0179011 A1* | 6/2017 | Hashizume | H01L 21/4842 |
| 2017/0256507 A1* | 9/2017 | Choe | H01P 1/20381 |

* cited by examiner

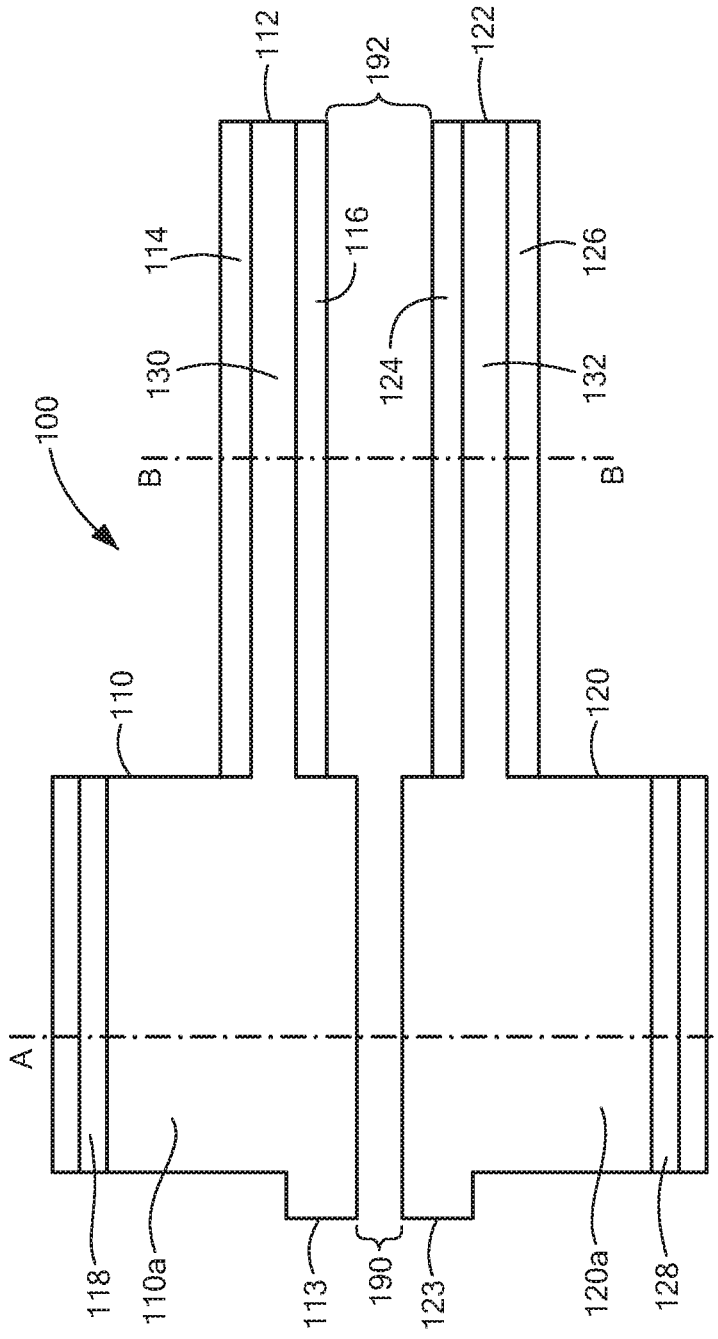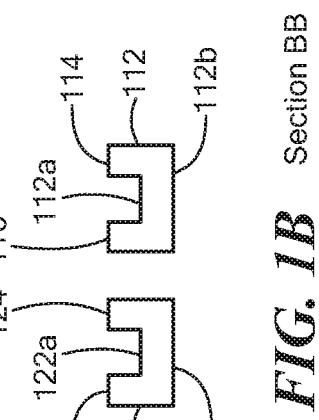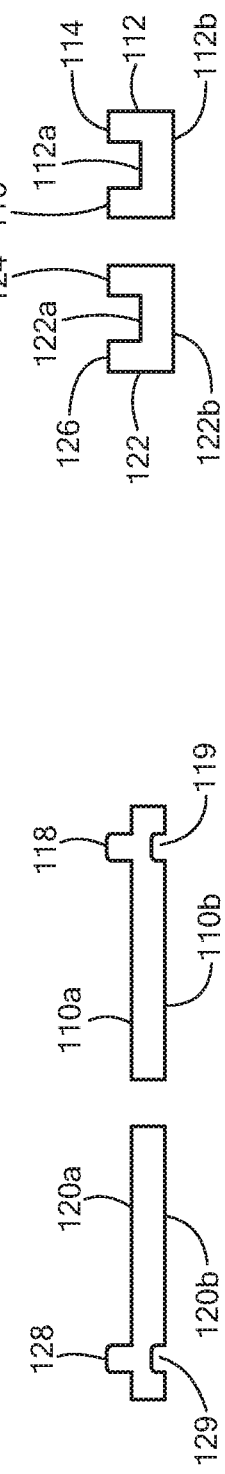
FIG. 1
FIG. 1A Section AA
FIG. 1B Section BB

INTEGRATED CIRCUIT PACKAGE HAVING A RAISED LEAD EDGE

CROSS REFERENCE TO RELATED APPLICATIONS

Not Applicable.

STATEMENT REGARDING FEDERALLY SPONSORED RESEARCH

Not Applicable.

FIELD

This disclosure relates generally to integrated circuit packaging and, more particularly, to an integrated circuit package having a lead frame with at least one lead with a raised edge to improve mechanical strength and/or stability.

BACKGROUND

Techniques for semiconductor packaging are well known in the art. In general, a semiconductor die is cut from a wafer, processed, and attached to a die attach pad of a lead frame. The subassembly may then be overmolded with a plastic or other insulative and protective material to form an integrated circuit (IC) package.

After packaging, the IC may then be placed on a circuit board with other components, including passive components such as capacitors, resistors, and inductors, which can be used for filtering and other functionality. For example, in the case of a magnetic field sensor integrated circuit containing a magnetic field sensing element, components such as capacitors are often required to reduce noise and enhance EMC (electromagnetic compatibility).

Magnetic field sensors including a magnetic field sensing element, or transducer, such as a Hall Effect element or a magnetoresistive element, are used in a variety of applications to detect aspects of movement of a ferromagnetic article, or target, such as proximity, speed, and direction. Illustrative applications include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect ignition timing from a position of an engine crankshaft and/or camshaft, and to detect a position and/or rotation of an automobile wheel for anti-lock braking systems.

In applications in which the ferromagnetic target is magnetic or of a hard ferromagnetic material, a magnetically permeable concentrator or magnetic flux guide is sometimes used to focus the magnetic field generated by the target on the magnetic field transducer, thus increasing the sensitivity of the sensor, allowing the use of a smaller magnetic target, and/or allowing the magnetic target to be sensed from a greater distance (i.e., a larger airgap). In other applications, in which the ferromagnetic target is not magnetic, a permanent magnet, sometimes referred to as a back bias magnet, may be used to generate the magnetic field that is then altered by movement of the target.

Generally, back bias magnets and concentrators are held in place relative to the magnetic field sensing element by mechanical means, such as an adhesive as shown in a U.S. Pat. No. 6,265,865 entitled "Single Unitary Plastic Package for a Magnetic Field Sensing Device," which is assigned to the Assignee of the subject application. Other sensors are manufactured so that the sensor and the back bias magnet or concentrator is integrally formed. A magnetic field sensor of this type is described in a U.S. Pat. No. 8,486,755 entitled "Magnetic Field Sensors and Methods for Fabricating the Magnetic Field Sensors," which is also assigned to the Assignee of the subject application and in which a concentrator or magnet may be formed by a liquid encapsulant or a combination of a liquid encapsulant and permanent magnet in a cavity on the side of the sensor opposite the target.

There are many package types and fabrication techniques in use for providing integrated circuit magnetic field sensors. For example, the semiconductor die in which the magnetic field sensing element is formed may be attached to a lead frame by various techniques, such as with an adhesive tape or epoxy, and may be electrically coupled to the lead frame by various techniques, such as with solder bumps or wire bonding. Also, the lead frame may take various forms and the semiconductor die may be attached to the lead frame in an orientation with the active semiconductor surface (i.e., the surface in which the magnetic field sensing element is formed) being adjacent to the lead frame in a so called "flip-chip" arrangement, with the active semiconductor surface opposite the lead frame surface in a so called "die up" arrangement, or with the semiconductor die positioned below the lead frame in a so called "lead on chip" arrangement.

Molding is often used in fabricating integrated circuit magnetic field sensors to provide the protective and electrically insulative overmold to the semiconductor die. Transfer molding has also been used to form two different molded portions for various reasons. For example, in a U.S. Pat. No. 7,816,772 entitled "Methods and Apparatus for Multi-Stage Molding of Integrated Circuit Package" which is assigned to the Assignee of the subject application, a first molded structure is formed over the semiconductor die to protect wire bonds and the device is overmolded with a second molded structure formed over the first molded structure

SUMMARY

The present disclosure provides an integrated circuit package including a lead frame having a first surface, a second opposing surface, at least one die attach portion configured to support at least one die, and a plurality of leads, and at least one of the plurality of leads has a raised feature extending along a portion of a length of the lead. In some examples, the raised feature of the lead is on the order of 0.025 mm to 0.2 mm. In an embodiment, the raised feature of the lead extends along at least approximately 25% of the length of the lead.

In one embodiment, the lead frame has a thickness between the first surface and the second opposing surface of between approximately 0.05 mm and 0.25 mm. In an embodiment, the lead frame comprises a copper material, a copper alloy material, or a nickel iron alloy material.

Another example embodiment provides an integrated circuit package with at least one of the plurality of leads having a plurality of spaced, raised features extending collinearly along the length of the lead.

In another embodiment, there are at least two die attach portions of the lead frame. A gap, or gaps, of approximately 0.05 mm to 0.5 mm may be present between the two or more die attach portions of the lead frame.

The integrated circuit package may include a passive component connected between at least two of the plurality of leads. Examples of passive components include a capacitor, resistor, inductor, or diode. A separation feature may be provided between the passive component and a connection area of the die attach portion of the lead frame.

In another example embodiment, the integrated circuit package lead frame may have at least one die attach portion comprising a raised feature.

In one embodiment, the die contains at least one magnetic field sensing element. The magnetic field sensing element may be a Hall Effect element, including but not limited to a planar or vertical Hall Effect element. In another embodiment, the magnetic field sensing element is a magnetoresistance element, including but not limited to a GMR, TMR, or AMR element. In another embodiment there may be more than one magnetic field sensing element present, including one example of three elements. In another embodiment the magnetic field sensing elements may be of different types, for example including but not limited to, a Hall Effect element and a magnetoresistance element.

In another embodiment an amplifier is included on the die. Signal processing circuits may also be included on the die in another embodiment. The leads may extend from a single side of the integrated circuit package to form a single in-line package.

In one embodiment a hard ferromagnetic element is included in the package. In another embodiment, a soft ferromagnetic material is included in the package. Another embodiment has both hard and soft ferromagnetic materials in the package.

Another example provides an energy harvesting structure on the die. One example has a moving coil structure on the die and a hard ferromagnetic material in the package. Another embodiment includes power conditioning circuitry in the package. In an embodiment, the moving coil structure and power conditioning circuitry are on the same die. A battery may be connected between at least two leads to provide an energy storage device.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the disclosure. Like numbers in the figures denote like elements. FIG. 1 shows a top view of a lead frame according to an embodiment;

FIG. 1A is a cross-sectional view of the lead frame of FIG. 1 taken along the line A-A of FIG. 1;

FIG. 1B is another cross-sectional view of the lead frame of FIG. 1 taken along line B-B of FIG. 1;

FIG. 2A is a cross-sectional view of the integrated circuit of FIG. 2 taken along line A-A of FIG. 2;

DETAILED DESCRIPTION

Figure 2:
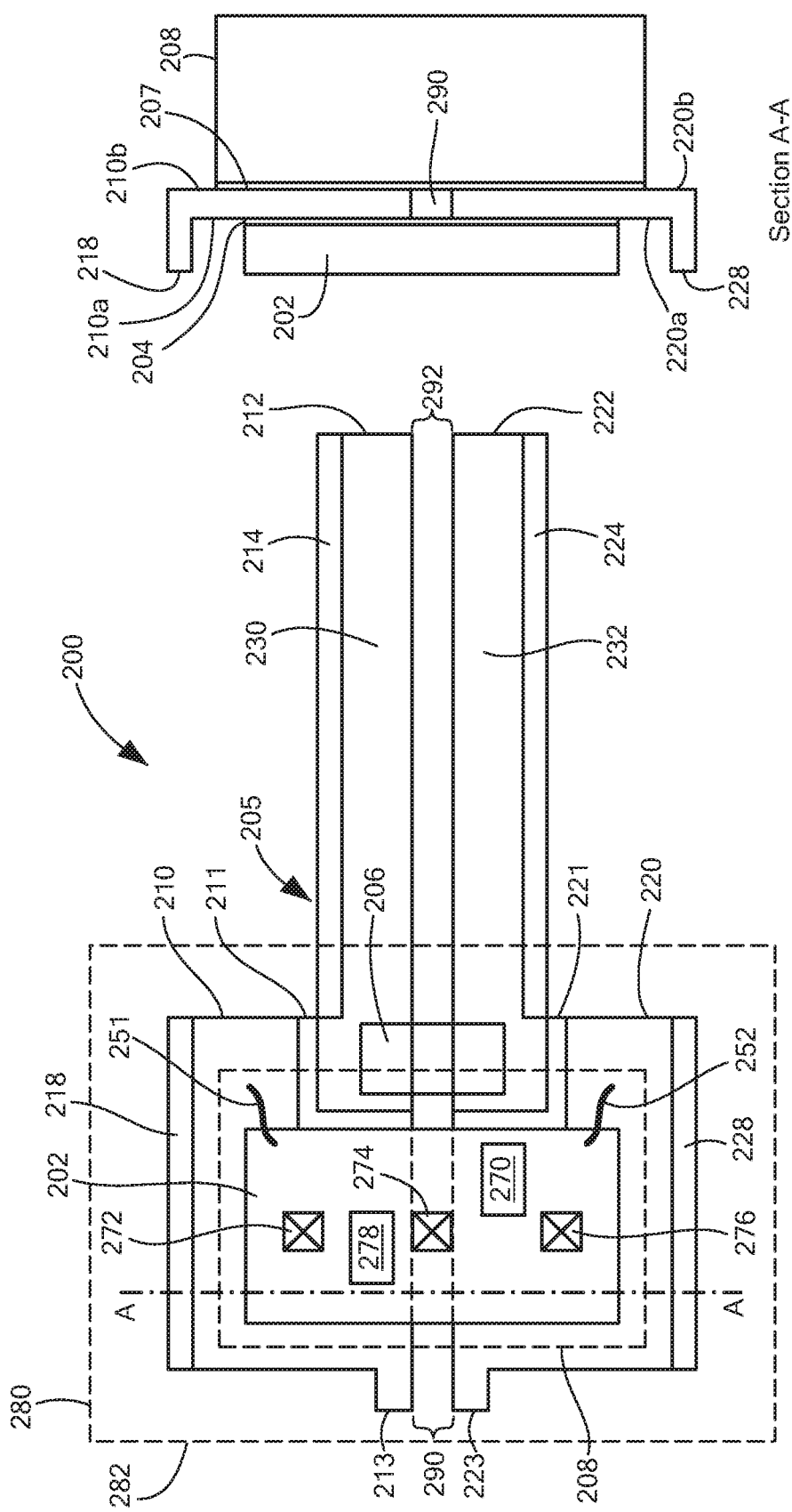
FIG. 2 shows a top view an integrated circuit containing an alternative lead frame, a substrate, and an integrated passive component according to an embodiment.

Referring to FIGS. 1, 1A, and 1B, a lead frame 100 for use in an electronic package (not shown) has a first surface 110a, 120a and a second opposing surface 110b, 120b and includes at least one die attach portion (and here two die attach portions 110, 120) and a plurality of leads (here two leads 112, 122). Each lead 112, 122 includes a connection portion 130, 132 extending away from a respective die attach portion 110, 120 and at least one raised feature. In the illustrated embodiment, each lead connection portion 130, 132 has two raised features 114, 116 and 124, 126, respectively, as shown.

The raised features 114, 116, 124, 126 are configured to increase the mechanical stiffness of the leads and reduce undesirable lead bending. With this arrangement the thickness of the lead frame material may be reduced, which lowers the materials cost of the electronic package. The actual thickness can be determined by the permissible amount of lead bending in an application. For an application where a ferromagnetic object is placed inside the electronic package, the resulting increased weight (mass) of the electronic package body can cause the leads to bend. Thinning the leads to reduce cost may result in undesired bending during manufacturing or use of a sensor or electronic package assembly. A magnetic field sensor may have reduced accuracy if the position of the sensing element(s) changes with respect to a target, or a current source (i.e. a current trace, or wire). One example of unintended position movements may be position tolerance of a sensor package caused by shock or vibration. By adding a raised feature, the leads are stiffer and less movement or placement or position tolerance results in the system using the electronic package.

The die attach portions 110, 120 may be referred to alternatively as die attach pads or die attach paddles and are configured to have a substrate (not shown) supporting circuitry attached thereto, as will be described further in connection with FIG. 2. The die attach portions 110, 120 are separated by a die attach gap 190 as may be on the order of between approximately 0.05 mm and 0.5 mm.

The lead connection portions 130, 132, referred to alternatively as leads, are configured to permit electrical connections to be made between circuits and/or systems external to the electronic package and circuitry supported by the substrate, which substrate is supported by one of more die attach portions 110, 120. The illustrated elongated lead connection portions 130, 132 extend from a single side of the resulting IC package in a so-called single in-line package configuration. It will be appreciated that although two leads are shown in the embodiment of FIG. 1, other numbers of leads and other lead configurations are possible.

In the example lead frame 100, the raised features 116 and 124 of lead connection portions 130, 132, respectively, are separated by a gap 192. In embodiments, the gap 192 may be on the order of between approximately 0.05 mm and 0.5 mm. The gap dimension may be selected based on various factors, such as the length of the connection portions 130, 132, and the lead frame material as examples.

In some embodiments, one or more of the die attach portions 110, 120 may additionally include one or more raised features. In the example lead frame 100, each die attach portion 110, 120 has a raised feature 118, 128 respectively. The raised features provide mechanical stiffness to the die attach portions 110, 120.

In the example lead frame 100, each of the raised features 114, 116, 124, 126, 118, 128 takes the form of raised elongated, relatively narrow, elevated section, or lip. In some embodiments, the connection portion of the leads (e.g., connection portion 130 of lead 112) has a length from a first end proximate to the respective die attach portion to a second end distal from the die attach portion and the raised features of the respective connection portion (e.g., raised features 114, 116) extend along approximately 25% of the connection portion length.

The raised lead frame features may be formed at or adjacent to an edge of the respective lead frame element (e.g., an edge of a connection portion or die attach portion). Alternatively, the raised features may be spaced from an edge of the respective element. For example, raised features 114 and 116 are formed at edges of lead frame connection portion 130; whereas raised feature 118 is spaced from an edge of the respective die attach portion 110, as shown. In other embodiments the raised features 114, 116, 124, 126 may be positioned away from the edges of the leads 112, 122.

The lead frame 100 may include tabs 113, 123 that allow for interconnection of the die attach portions 110, 120 during the manufacturing process (for example, die attach and wire bonding, or flip chip assembly, and over molding). After package overmolding, the tabs 113, 123 can be cut to separate the die attach portions 110, 120 from the rest of the lead frame 100 before or after package molding. If the separation occurs before package overmolding the isolation voltage may be increased for the final package. A similar or the same cutting step may be performed at the ends of the leads 112, 122 distal from the die attach portions 110, 120 to separate the leads from the rest of the lead frame.

Example materials for lead frame 100 include copper, copper alloys, NiFe alloys, or other alloys. The thickness of the lead frame 100 from the first surface 110a, 120a to the second surface 110b, 120b may be on the order of approximately 50 to 250 microns. In other embodiments, the lead frame material may be thicker for example between approximately 300 to 400 microns to reduce movement of the package during the final operation or in the final application of the electronic sensor package.

The raised features 114, 116, 118, 124, 126, 128 may be formed by various techniques, such as bending, stamping, and/or coining, chemical etching, laser etching, or removal or grinding away of the lead frame material. The raised features 114, 116, 118, 124, 126, 128 may be formed by the same or a similar process as each other or by one or more different processes.

Depending on the manufacturing technique(s) used, the second surface 110b, 120b of the die attach portions may have recessed features that are complementary with respect to the raised features extending from the first surface 110a, 120a as can be readily seen in the cross-sectional view of FIG. 1A for example. More specifically, in an embodiment in which raised features 118, 128 are formed by stamping, complementary recessed features 119, 129 may be formed in the opposite surface 110b, 120b of the lead fame as shown. In other embodiments, for example, where the raised features 114, 116 are formed by bending, a second surface 112b of the lead 112 opposite the surface 122a from which the raised features 114, 116 extend may be flat, as shown in the cross-sectional view of FIG. 1B for example.

The raised features of the die attach areas 110, 120 and of leads 112, 122 are not required to extend from the same lead frame surface. For example, raised features 118, 128 may extend from opposite surfaces of the lead frame 100 in some embodiments (i.e., raised feature 118 may extend from the first surface 110a of die attach portion 110 and raised feature 128 may extend from the second surface 120b of die attach portion 120). In other embodiments, the leads 112, 122 may be have respective raised features formed by stamping where the raised features may extend from different surfaces of the respective lead. For example, lead 112 has a first surface 112a and a second surface 112b and lead 122 has a first surface 122a and a second surface 122b. Feature 114 may extend from lead surface 112a and feature 116 may extend from the opposite lead surface 112b.

Figure 3:
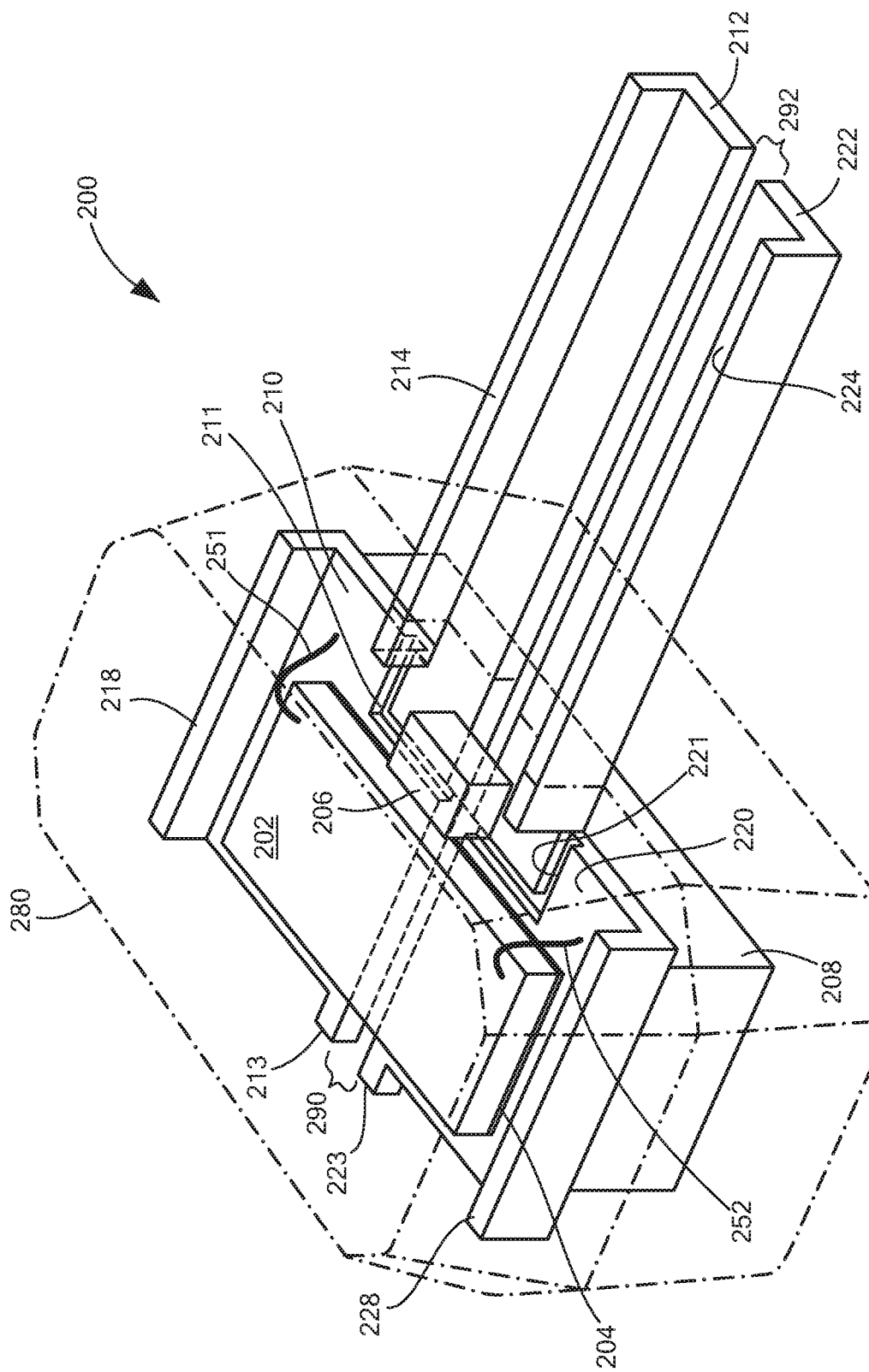
FIG. 3 is an isometric view of the integrated circuit of FIG. 2.

Referring to FIGS. 2, 2A, and 3, an integrated circuit package 200 includes a lead frame 205 having die attach portions 210, 220 and leads 212, 222 extending from a respective die attach portion. Lead frame 205 includes several features similar to lead frame 100 of FIG. 1, including leads 212, 222, each having a respective elongated connection portion 230, 232, raised features 214, 224 (that can be the same as or similar to raised features 114, 126 of FIG. 1), raised features 218, 228 (that can be the same as or similar to raised features 118, 128 of FIG. 1), and tabs 213, 223 (that can be the same as or similar to tabs 113, 123 of FIG. 1).

Lead frame 205 differs from lead frame 100 (FIG. 1) in that it includes separation features 211, 221 as will be described. Also, leads 212, 222 each have a single raised feature 214, 224, respectively, rather than two raised features in FIG. 1. Die attach portions 210, 220 are each shown with only one raised feature 218, 228, respectively, as contrasted to the two raised features of the die attach portions 110, 120 of FIG. 1.

The die attach portions 210, 220 are separated by a die attach gap 290 and the lead connection portions 230, 232 are separated by a gap 292. In embodiments, both such gaps 290, 292 can be the approximately the same size, as shown, for example on the order of between approximately 0.05 mm and 0.5 mm. In other embodiments, gaps 290, 292 may be different sizes.

Tabs 213, 223 are shown in a position that would be inside of molded body 280. Such an embodiment allows for isolation between the die attach portions 210, 220 and the outer edge 282 of the package 280. This type of embodiment with isolation may be used for, but is not limited to, current sensor applications. In another embodiment the tabs 213, 223 extend to the edge 282 or beyond the edge 282 of the package body 280.

Integrated circuit package 200 further includes at least one electronic circuit die 202 supported by die attach portions 210, 220, at least one electronic component 206, at least one ferromagnetic element 208, and a molded body 280. The die 202 may take various forms, such as a semiconductor substrate (e.g., comprising silicon, germanium, gallium arsenide, or any other suitable type of semiconductor material) or may be comprised of any other material suitable for supporting circuitry or magnetic field sensing elements such as glass or ceramic. Die 202 is shown to support three transducer or sensing elements 272, 274, 276. Wire bonds 251, 252 connect the die 202 to the die attach portions 210, 220, respectively.

Separation features 211, 221 extend between the electronic component 206 and an interface (connection) area of the die attach portions 210, 220, to which wire bonds 251, 252 are connected as shown. The separation features 211, 221 prevent unwanted material flow, for example as a result of a solder process or other connection process, from die attach portion area to which the electronic component 206 is attached to the interface area to which the wire bonds are attached, since such material flow may interfere with the electrical or mechanical connection of the wire bonds 251, 252 to die attach portions 210, 220. Separation features 211, 221 may take various forms such as stamped or etched recesses into the die attach portion surfaces 210a, 220a.

In another embodiment, the die 202 may only be attached to a single die attach portion, for example 210, in which the die attach pad 210 size and shape may be expanded to extend under the entire die 202. In such an embodiment, die attach portion 220 may be smaller and act as a wire bond connection portion for the bonding of the wire 252 to connect the die and electronic component 206 to lead 222. The passive element 206 may or may not be present. If the passive element were present the die attach portion 220 would have space sufficient to allow for the passive attachment of the element 206 to the lead 222.

In another embodiment the raised features 214, 224 along one edge of the leads 212, 222 may be replaced by a coined or otherwise formed features positioned along the center or at some other position of the leads 212, 222.

Die 202 may also have integrated circuit elements (represented generally by block 270), for example passive components such as resistors, capacitors and inductors, active components such as transistors, or combinations of passive and active components. In some embodiments the active and passive components form current or voltage sources to supply the transducer or sensing elements with power and also contain measuring circuits and signal processing circuits to provide amplification of the sensing element signals to the leads.

Ferromagnetic element 208 may be a hard or soft ferromagnetic material, or a combination of two or more ferromagnetic elements which may include a hard ferromagnetic material and a soft ferromagnetic material. Examples of hard ferromagnetic materials include, but are not limited to, hard ferrites, NdFeB, and SmCo. Examples of soft ferromagnetic materials include, but are not limited to, steel, NiFe alloys, NiFeMo alloys, and soft ferrite materials. In another embodiment element 208 is not included in the package.

FIG. 2A provides a side view across line A-A of FIG. 2. The die 202 is connected to the surface 210a, 220a of die attach portions 210, 220 by an attachment material 204. The attachment material 204 may include, but is not limited to: an epoxy (either conducting or non-conducting), Die Attach Film (DAF), Wafer Backside Coating (WBC), an adhesive material, a double-sided adhesive tape, or a solder material (solder material may be preferred in a flip-chip attachment of the die to the lead frame). An attachment material 207 connects the surface 210b, 220b of the die attach portions 210, 220 to the ferromagnetic element 208, and likewise may include similar materials as used for attaching the die 202 to the surface 210a, 220a of the die attach portions 210, 220.

The electronic component 206 may be a capacitor, inductor, resistor, diode, or other electronic component. In other embodiments multiple components (not shown) may be placed inside of the package body 280.

In another embodiment the die 202 has integrated circuit elements. In one embodiment the integrated circuit element is an integrated circuit amplifier on the die 202. In another embodiment the die 202 includes signal processing circuitry to provide an output of at least one magnetic field sensing element. This signal processing circuitry may include but is not limited to: temperature compensation circuitry, threshold circuitry, ESD protection, output protocol circuitry.

Figure 4:
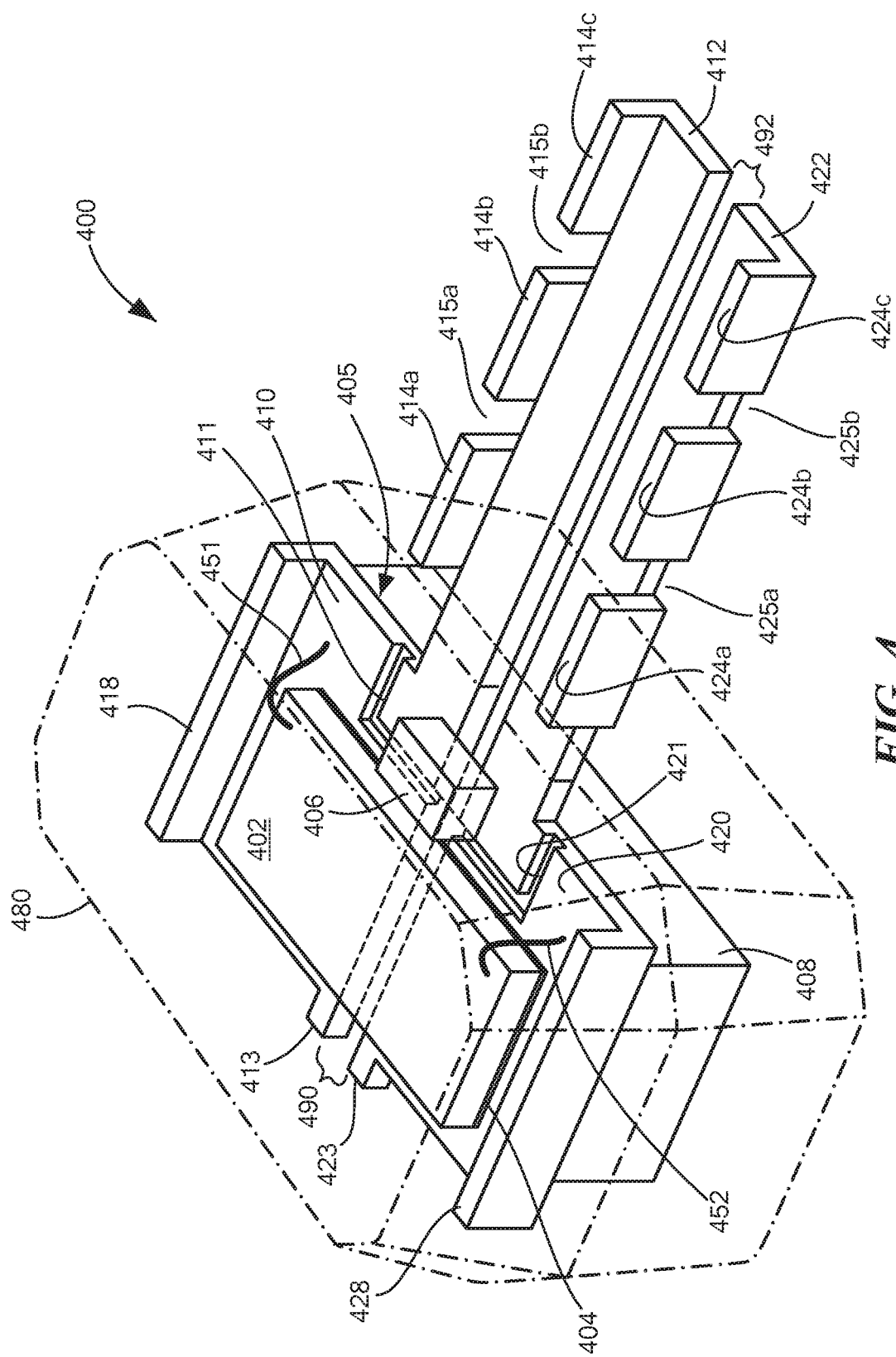
FIG. 4 is an isometric view of an integrated circuit containing another alternative lead frame according to an embodiment.

FIG. 4 shows an isometric view of an electronic package 400 similar to the package 200 of FIG. 3 but including a different lead frame 405. Lead frame 405 includes at least one (and here again two) die attach portions 410, 420, a plurality of leads 412, 422, separation portions 411, 421, and tabs 413, 423. Lead frame 405 differs from lead frame 205 in that the leads 412, 422 have different raised features as will be described.

In addition to lead frame 405, package 400 includes die 402 attached to the die attach portions 410, 420 with attachment means 404, wire bonds 451, 452, electronic component 406, ferromagnetic element 408, and package body 480, all of which may be the same as or similar to like features of the integrated circuit package 200 of FIGS. 2 and 3. Wire bonds 451, 452 electrically connect die 402 to die attach portions 410, 420. Ferromagnetic element 408 is shown on the backside of the lead frame die attach portions 410, 420 (attachment layer not shown). Tabs 413, 423 are provided connect the leads to the frame portion (not shown) of the lead frame during manufacturing. In this embodiment, the gaps 490 and 492 between the die attach portions 410, 420 and lead portions 412, 422, respectively, are the same size. In other embodiments, gaps 490, 492 may be different sizes. Raised features 418, 428 are provided on the die attach portions 410, 420.

Leads 412, 422 extend away from the die attach portions 410, 420 and have raised features 414a, 414b, 414c, 424a 424b, 424c that are not continuous along the length of the leads 412, 422 and are separated by gaps 415a, 415b, 425a, 425b. Raised features 414a, 424a are also shown on the outside of the package molded body 480. In another embodiment, the raised features 414a, 424a may extend through package body 480 as do the raised features 314, 324 in FIG. 3.

Although each lead 412, 422 is shown with three raised features (414a, 414b, 414c, 424a, 424b, 424c) and two gaps (415a, 415b, 425a, 425b) other numbers of raised features and gaps are possible, including just one raised feature per lead, or more than three raised features per lead. Another embodiment may have just one raised feature that does not extend the full length of a lead, for example the raised portion of the lead 412, 422 may just consist of 414a, 424a and gaps 415a, 425a may extend to the end of the leads 412, 422. Other lengths of the raised portions of the leads 412, 422 are also possible.

The gaps between raised features 415a, 415b, 425a, 425b allow for the leads 412, 422 to be bent at the locations of the gaps to position the leads for a final application. In one embodiment the gaps 415a, 415b, 425a, 425b are at least approximately 200 microns. Other gap dimensions are also possible to allow for the amount of bending of the leads 412, 422 that is required for an application or installation of the integrated circuit package.

Although the embodiments in the drawings show only two leads, other numbers of leads are possible and do not stray from the present disclosure. For example, another embodiment of the electronic package may have three, four, five, six, seven, or eight leads.

Applications of the embodiments described herein may include but are not limited to automotive magnetic field sensors; i.e. wheel speed, cam shaft, or transmission; current sensors; or energy harvesting devices.

An energy harvesting device is an element that can generate power. For example, placing a moving coil element (illustrated by block 278 in FIG. 2) on semiconductor die 202 with integrated circuitry 270 in a package such as package 200 (FIG. 2) or package 400 (FIG. 4) with a hard ferromagnetic element 208 or 408 will generate current as the coil moves due to mechanical vibrations. Circuit elements (as illustrated generally by block 270 in FIG. 2) may be included on the semiconductor die to provide power correction or rectification. A passive element 206, 406 can be used to provide short term energy storage. In another embodiment, the passive element 206 could be replaced with a battery, or other longer term energy storage device. In another embodiment, the energy harvesting device and the circuit elements may be on different die.

Having described preferred embodiments which serve to illustrate various concepts, systems circuits, packages and techniques, which are the subject of this patent, it will now become apparent to those of ordinary skill in the art that other embodiments incorporating these concepts, systems circuits, packages and techniques may be used. For example, it should be noted that individual concepts, features (or elements) and techniques of different embodiments described herein may be combined to form other embodiments not specifically set forth above. Furthermore, various concepts, features (or elements) and techniques, which are described in the context of a single embodiment, may also be provided separately or in any suitable sub-combination. It is thus expected that other embodiments not specifically described herein are also within the scope of the following claims.

In addition, it is intended that the scope of the present claims include all other foreseeable equivalents to the elements and structures as described herein and with reference to the drawing figures. Accordingly, the subject matter sought to be protected herein is to be limited only by the scope of the claims and their equivalents. It is felt, therefore that the concepts, systems, circuits and techniques described herein should not be limited by the above description, but only as defined by the spirit and scope of the following claims which encompass, within their scope, all such changes and modifications.

All publications and references cited herein are expressly incorporated herein by reference in their entirety.

What is claimed is:

1. An integrated circuit package comprising:
   a lead frame having a first surface, a second opposing surface, at least one die attach portion configured to support at least one die and having a first thickness from the first surface of the lead frame to the second surface of the lead frame in a first direction, the at least one die attach portion being positioned inside a molded body, and a plurality of leads, each lead having an elongated connection portion attached to and extending from a respective one of the at least one die attach portion to a distal end exterior to the molded body co-planarly with respect to the respective one of the at least one die attach portion, wherein the elongated connection portion of at least one of the plurality of leads has a raised feature extending along a portion of a length of the elongated connection portion, and wherein the raised feature has a second thickness from a bottom surface to a top surface in the first direction, wherein the second thickness is greater than the first thickness.

2. The integrated circuit package of claim 1 wherein the raised feature of the lead extends along at least approximately 25% of the length of the elongated connection portion.

3. The integrated circuit package of claim 1 wherein at least one of the plurality of leads has a plurality of spaced, raised features extending collinearly with respect to each other along the length of the elongated connection portion.

4. The integrated circuit package of claim 1 further comprising:
   a passive component connected between at least two of the plurality of leads.

5. The integrated circuit package of claim 4 wherein the passive component comprises one or more of a capacitor, resistor, inductor, or diode.

6. The integrated circuit package of claim 4 further comprising:
   a separation feature between said passive component and a connection area of said at least one die attach portion.

7. The integrated circuit package of claim 1 wherein the at least one die attach portion is configured to support at least one die on the first surface of the lead frame and comprises a die attach portion raised feature extending from the first surface of the lead frame.

8. The integrated circuit package of claim 1 wherein the second thickness of the raised feature of the elongated connection portion is on the order of 0.025 mm to 0.2 mm.

9. The integrated circuit package of claim 1 wherein the at least one die attach portion comprises at least two die attach portions spaced apart by a gap.

10. The integrated circuit package of claim 9 wherein the gap is between approximately 0.05 mm and 0.5 mm.

11. The integrated circuit package of claim 1 further comprising:
    at least one magnetic field sensing element.

12. The integrated circuit package of claim 11 wherein the at least one magnetic field sensing element comprises at least one Hall Effect element.

13. The integrated circuit package of claim 11 wherein the at least one magnetic field sensing element comprises at least one magnetoresistance element.

14. The integrated circuit package of claim 13 wherein the magnetoresistance element comprises one or more of a giant magnetoresistance (GMR) or tunneling magnetoresistance element (TMR).

15. The integrated circuit package of claim 1 further comprising:
    a hard ferromagnetic element.

16. The integrated circuit package of claim 1 wherein the first thickness of the lead frame between the first surface and the second opposing surface is between approximately 0.05 mm and 0.25 mm.

17. The integrated circuit package of claim 1 wherein the lead frame comprises one or more of a copper material, a copper alloy material, or a nickel iron alloy material.

18. The integrated circuit package of claim 1 wherein the plurality of leads extend from a single side of the package to form a single in-line package.

19. The integrated circuit package of claim 1 further comprising:
    at least one integrated circuit amplifier supported by said die.

20. The integrated circuit package of claim 1 further comprising:
    signal processing circuitry supported by said die.

21. The integrated circuit package of claim 1 further comprising:
    an energy harvesting structure on the at least one die.

22. The integrated circuit package of claim 21 further comprising:
    a hard ferromagnetic element attached to the lead frame; and
    a moving coil structure on said at least one die.

23. The integrated circuit package of claim 21 further comprising:
power conditioning circuitry supported by said die.

24. The integrated circuit package of claim 21 further comprising:
a battery element connected between at least two of the plurality of leads.

25. An integrated circuit package comprising:
a lead frame having a first surface, a second opposing surface, at least one die attach portion configured to support at least one die, and a plurality of leads, each lead having an elongated connection portion attached to and extending from a respective one of the at least one die attach portion and co-planar with respect to the respective one of the at least one die attach portion, wherein the elongated connection portion of at least one of the plurality of leads has a plurality of spaced, raised features extending collinearly with respect to each other along a length of the elongated connection portion.

26. The integrated circuit package of claim 25 further comprising:
a passive component connected between at least two of the plurality of leads.

27. The integrated circuit package of claim 26 wherein the passive component comprises one or more of a capacitor, resistor, inductor, or diode.

28. The integrated circuit package of claim 25 wherein the at least one die attach portion is configured to support the at least one die on the first surface of the lead frame and comprises a die attach portion raised feature extending from the first surface of the lead frame.

29. The integrated circuit package of claim 25 wherein the at least one die attach portion comprises at least two die attach portions spaced apart by a gap.

30. The integrated circuit package of claim 25 further comprising:
a hard ferromagnetic element.

31. An integrated circuit package comprising:
a lead frame having a first surface, a second opposing surface, at least one die attach portion configured to support at least one die, and a plurality of leads, each lead having an elongated connection portion attached to and extending from a respective one of the at least one die attach portion and co-planar with respect to the respective one of the at least one die attach portion, wherein the elongated connection portion of at least one of the plurality of leads has a raised feature extending along a portion of a length of the elongated connection portion; and
an energy harvesting structure on the at least one die, wherein the energy harvesting structure comprises a moving coil structure on the at least one die.

32. The integrated circuit package of claim 31 further comprising:
a passive component connected between at least two of the plurality of leads.

33. The integrated circuit package of claim 32 wherein the passive component comprises one or more of a capacitor, resistor, inductor, or diode.

34. The integrated circuit package of claim 31 wherein the at least one die attach portion is configured to support at least one die on the first surface of the lead frame and comprises a die attach portion raised feature extending from the first surface of the lead frame.

35. The integrated circuit package of claim 31 wherein the at least one die attach portion comprises at least two die attach portions spaced apart by a gap.

36. The integrated circuit package of claim 31 further comprising:
a hard ferromagnetic element.

* * * * *